US 10,014,369 B2

(12) United States Patent
Tang et al.

(10) Patent No.: US 10,014,369 B2
(45) Date of Patent: Jul. 3, 2018

(54) SUPER-JUNCTION SEMICONDUCTOR DEVICE

(71) Applicant: SUPER GROUP SEMICONDUCTOR CO., LTD., Hsinchu County (TW)

(72) Inventors: Sung-Nien Tang, Hsinchu County (TW); Ho-Tai Chen, Hsinchu County (TW); Hsiu-Wen Hsu, Hsinchu County (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 0 days.

(21) Appl. No.: 15/421,588

(22) Filed: Feb. 1, 2017

(65) Prior Publication Data

US 2017/0309705 A1    Oct. 26, 2017

(30) Foreign Application Priority Data

Apr. 21, 2016  (TW) .............................. 105112421 A

(51) Int. Cl.
*H01L 29/06* (2006.01)
*H01L 29/10* (2006.01)
(Continued)

(52) U.S. Cl.
CPC ........ *H01L 29/0634* (2013.01); *H01L 23/585* (2013.01); *H01L 23/60* (2013.01);
(Continued)

(58) Field of Classification Search
CPC ........... H01L 29/66712; H01L 29/7802; H01L 29/0634; H01L 29/0696; H01L 29/7811;
(Continued)

(56) References Cited

U.S. PATENT DOCUMENTS

2003/0222327 A1* 12/2003 Yamaguchi ......... H01L 29/0634
257/500
2008/0076223 A1* 3/2008 Ninomiya ........... H01L 29/0634
438/270
(Continued)

FOREIGN PATENT DOCUMENTS

TW          200917476 A       4/2009
TW          201007947 A1      2/2010
(Continued)

*Primary Examiner* — Walter H Swanson
(74) *Attorney, Agent, or Firm* — Li & Cai Intellectual Property (USA) Office

(57) ABSTRACT

A super junction semiconductor device is provided. The super-junction semiconductor device includes a substrate, a drift layer disposed on the substrate, an insulating layer, a lightly-doped region, and a main loop-shaped field plate. The drift layer includes a plurality of n- and p-type doped regions alternately arranged in parallel to form a super-junction structure, and defines a cell region and a termination region surrounding the cell region. The lightly-doped region is formed in the drift layer and connected to a surface of the drift layer. The lightly-doped region has a first end portion closer to the cell region and a second end portion farther away from the cell region. The insulating layer disposed on the drift layer covers the termination region. The main loop-shaped field plate is disposed on the insulating layer and covers the second end portion.

13 Claims, 7 Drawing Sheets

(51) Int. Cl.
  *H01L 29/78* (2006.01)
  *H01L 29/40* (2006.01)
  *H01L 23/58* (2006.01)
  *H01L 23/60* (2006.01)
(52) U.S. Cl.
  CPC ...... *H01L 29/0696* (2013.01); *H01L 29/1095* (2013.01); *H01L 29/402* (2013.01); *H01L 29/408* (2013.01); *H01L 29/7811* (2013.01)
(58) Field of Classification Search
  CPC . H01L 29/402; H01L 23/585; H01L 29/1095; H01L 29/408
  See application file for complete search history.

(56) References Cited

U.S. PATENT DOCUMENTS

| | | | |
|---|---|---|---|
| 2010/0207237 A1* | 8/2010 | Yao | H01L 23/562 257/508 |
| 2011/0115033 A1* | 5/2011 | Tamaki | H01L 29/7395 257/409 |
| 2014/0117437 A1* | 5/2014 | Willmeroth | H01L 29/7802 257/329 |

FOREIGN PATENT DOCUMENTS

| | | |
|---|---|---|
| TW | 201030972 A1 | 8/2010 |
| TW | 201234524 A | 8/2012 |
| TW | 201347188 A | 11/2013 |
| TW | 201607038 A | 2/2016 |

\* cited by examiner

SUPER-JUNCTION SEMICONDUCTOR DEVICE

BACKGROUND OF THE INVENTION

1. Field of the Invention

The instant disclosure relates to a semiconductor device; in particular, to a MOSFET having a super junction structure.

2. Description of Related Art

For a super junction transistor device, the on-resistance (Rds-on) increases in direct proportion to the breakdown voltage (BV), and is a much less dramatic increase than in the conventional semiconductor structure. Accordingly, the super junction transistors device provides a way to achieve low on-resistance (Rds-on), while maintaining a high off-state breakdown voltage (BV).

The super junction device usually includes an active region and a termination region surrounding the active region. In the OFF-state of the super-junction device, the electric field is produced along vertical and horizontal directions of the termination region.

The conventional super junction transistor device has the p-typed doped regions in a loop shape positioned at the termination region. However, during the formation of the loop-shaped p-type doped regions by an epitaxial process, a specific lattice plane has to be formed at each corner of the loop-shaped p-type doped regions so that the loop-shaped p-type doped regions have preferred lattice arrangements at each corner thereof. As such, it raises the difficulty of the fabrication process of the loop-shaped p-type doped regions. Additionally, it is not easy to control the implant concentration at the corner regions of the loop-shaped p-type doped regions, which may result in lower withstand voltage of the super junction semiconductor device at the termination region.

SUMMARY OF THE INVENTION

In order to achieve the aforementioned objects, a super junction semiconductor device is provided in the instant disclosure, in which the super-junction semiconductor device has a plurality of p-type doped regions in stripe shape. In conjunction with the loop-shaped field plate, each of the p-type doped regions positioned in a cell region extends respectively toward two opposite sides of the cell region till the two ends of each p-type doped region are positioned in the termination region so that the off-state breakdown voltage of the super junction semiconductor device can satisfy the requirements for practical use.

A super-junction semiconductor device provided in one of the embodiments of the instant disclosure includes a substrate, a drift layer, a lightly-doped region, an insulating layer, and a main loop-shaped field plate. The drift layer is disposed on the substrate and has a surface opposite to the substrate. The drift layer includes a plurality of n-type doped regions and a plurality of p-type doped regions extending from the surface toward the substrate and arranged alternately to form a super-junction structure, and the drift layer defines a cell region and a termination region surrounding the cell region. The lightly-doped region is formed in the drift layer and connected to the surface of the drift layer, and the lightly-doped region has a first ending portion closer to the cell region and a second ending portion farther away from the cell region. The insulating layer is disposed on the surface to cover the termination region. The main loop-shaped field plate is disposed on the insulating layer so that the main loop-shaped field plate covers the second ending portion.

To sum up, in the super-junction semiconductor device provided in the instant disclosure, by making the main loop-shaped field plate cover the second ending portion of the lightly-doped region to decrease the electric field strength generated at the second ending portion, the breakdown voltage of the super-junction semiconductor device can be improved. Additionally, in the super-junction semiconductor device of the instant disclosure, the p-type doped regions positioned in the cell region extend to the termination region in two opposite directions. Compared to the conventional super-junction transistor device, the uniformity of the epitaxy and the complexity of the fabrication process can be improved during the epitaxial process of the p-type doped regions without having any corner.

In order to further the understanding regarding the instant disclosure, the following embodiments are provided along with illustrations to facilitate the disclosure of the instant disclosure.

DETAILED DESCRIPTION OF THE PREFERRED EMBODIMENTS

Figure 1:
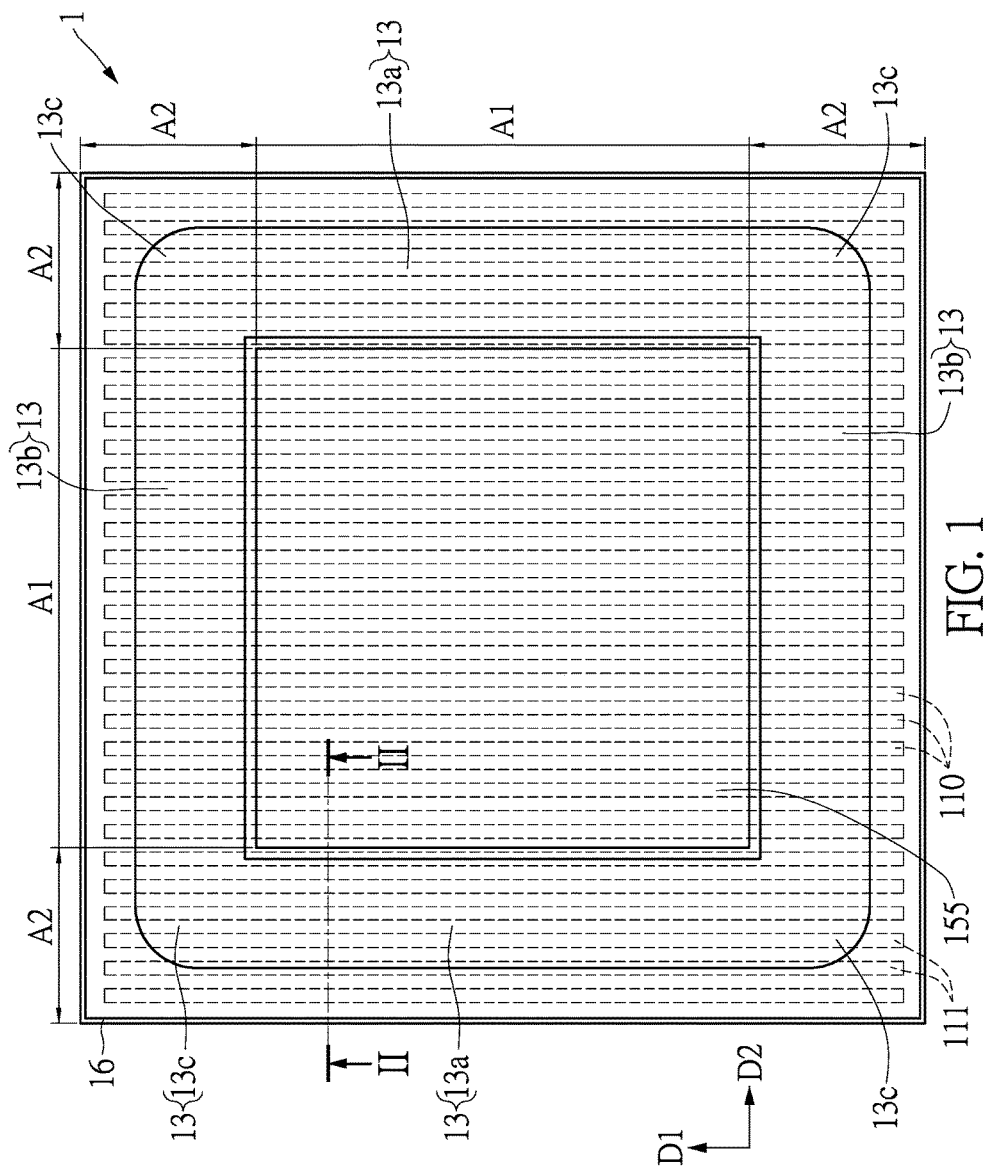
FIG. 1 shows a top view of a super junction semiconductor device according to an embodiment of the instant disclosure.
Figure 2:
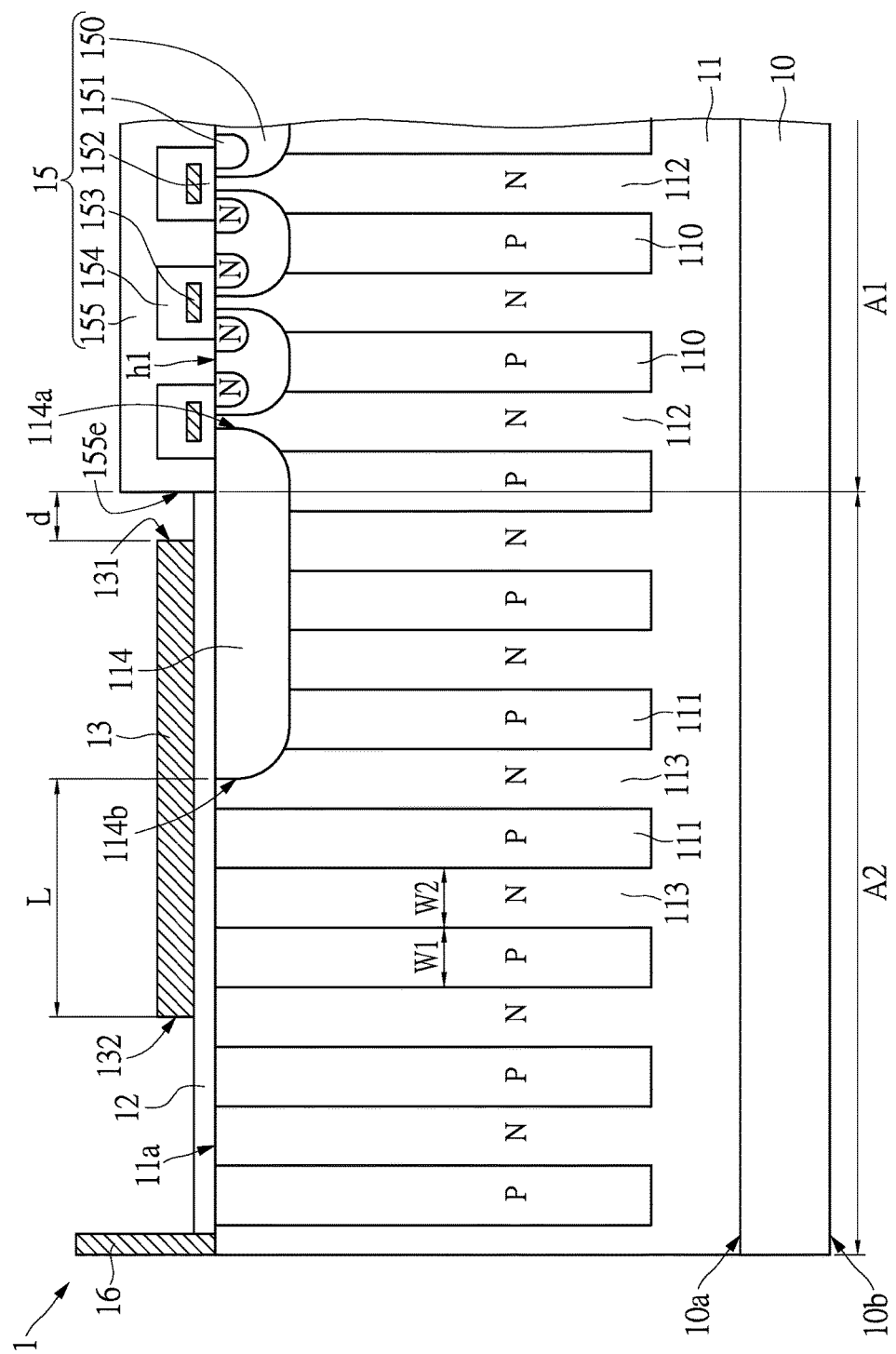
FIG. 2 shows a cross-sectional view taken on a line II-II of FIG. 1.

Please refer to FIG. 1 and FIG. 2. FIG. 1 shows a top view of a super junction semiconductor device according to an embodiment of the instant disclosure, and FIG. 2 shows a cross-sectional view taken on a line II-II of FIG. 1.

The super-junction semiconductor device 1 includes a substrate 10, a drift layer 11, a lightly-doped region 114, an insulating layer 12, a main loop-shaped field plate 13, and at least one transistor structure 15.

As shown in FIG. 2, the substrate 10 is made of a semiconductor and has an upper surface 10a and a back surface 10b opposite to the upper surface 10a. The substrate 10 is heavily doped with first conductivity type impurities which are distributed in a local region or throughout the substrate 10 to form a drain contact layer. In the instant embodiment, the first conductivity type impurities are distributed throughout the substrate 10, which is only used as an example, but not so as to limit the scope of the invention. A drain contact pad (not shown in FIG. 2) is formed on the back surface 10b of the substrate 10 to be electrically connected to an external control circuit.

The aforementioned first conductivity type impurities can be n- or p-type conductivity impurities. Assuming the substrate 10 is made of silicon, the n-type conductivity impurities may be Group V ions such as phosphorus ions or arsenic ions, and the P-type conductivity impurities may be Group III ions such as boron ions, aluminum ions or gallium ions.

The drift layer 11 is disposed on the upper surface 10a of the substrate 10 and lightly doped with first conductivity type impurities. In the instant embodiment, the substrate 10 is a heavily N-type doping (N$^+$) substrate and the drift layer 11 is a lightly N-type doping (N$^-$) layer. The drift layer 11 has one surface connecting to the upper surface 10a of the substrate 10 and a surface 11a at a side opposite to the substrate 10.

As shown in FIG. 1 and FIG. 2, the drift layer 11 defines a cell region A1, and a transition region A2 surrounding the cell region A1. As shown in FIG. 1, the cell region A1 is a central region of the super-junction semiconductor device 1, and the termination region A2 surrounding the cell region A2 is a peripheral region of the super-junction semiconductor device 1.

Please refer to FIG. 2. The drift layer 11 includes a plurality of n-type doped regions 112, 113 and a plurality of p-type doped regions 110, 111 arranged alternately to form a super-junction structure. Furthermore, the n-type doped regions 112, 113 and the p-type doped regions 110, 111 extend along a circuit flow direction, i.e., extend from the surface 11a toward the substrate 10.

Please refer to FIG. 1. In the instant embodiment, some of the p-type doped regions 110 are arranged in the cell region A1 and extend in two opposite directions to the termination region A2. That is, a central portion of each p-type doped region 110 is located in the cell region A1, a front ending portion and rear ending portion of each p-type doped region 110 are located in the termination region A2.

In addition, in the embodiment shown in FIG. 2, each p-type doped regions 110, 111 is in a pylon shape, and the n-type doped regions 112, 113 surround the pylon shaped p-type doped regions 110, 111. Specifically, the p-type doped regions 110, 111 can be formed by the steps of forming a plurality of trenches in the drift layer 11 and filling a p-type epitaxial material into the trenches.

When the super-junction semiconductor device 1 is in the ON state, the n-type doped regions 112, 113 and the p-type doped regions 110, 111 can provide charges. When the super-junction semiconductor device 1 is in the OFF state, the n-type doped regions 112, 113 and the p-type doped regions 110, 111 are depleted to each other in the horizontal direction so as to balance the charges in the drift layer 11. As such, the super-junction semiconductor device 1 can have higher breakdown voltage under the condition of relatively lower on-resistance.

The non-uniform impurity concentrations of the p-type doped regions 110, 111 may result the charges in the drift layer 11 not being depleted completely resulting in a lower breakdown voltage of the super-junction semiconductor device 1. Accordingly, in the embodiment of the instant embodiment, the p-type doped regions 110, 111 are arranged in the drift layer 11 parallel to one another, and each of the p-type doped regions 110, 111 has no curved section. As such, making the p-type doped regions 110, 111 have more uniform impurity concentrations can be easily achieved, which may result in a higher withstand voltage of the super-junction semiconductor device 1.

Since the p-type doped regions 110, 111 are arranged in the drift layer 11 parallel to one another and each of the p-type doped regions 110, 111 has no curved portion, the consideration of whether the lattice planes of the p-type doped regions 110, 111 match with each other or not can be omitted during the fabrication process of the p-type doped regions 110, 111 by filling the p-type epitaxial material (in the trenches), thus reducing the fabrication difficulty and improving the epitaxial quality of the p-type doped regions 110, 111.

In the instant embodiment, each of the p-type doped regions 110, 111 has a first width W1 and a first concentration p1, and each of the n-type doped regions 112, 113 has a second width W2 and a second concentration n1. Furthermore, two adjacent p-type doped regions 110, 111 are separated from each other by a predetermined distance which is the second width W2 of each of the n-type doped regions 112, 113. In one embodiment, the first width W1, the second width W2, the first concentration p1, and the second concentration n1 satisfy the following relationship: $p1 \times W1 \approx n1 \times W2$.

Notably, the area of the termination region A2 also correlates with the breakdown voltage of the super-junction semiconductor device 1. The breakdown voltage usually increases with the increase of the area of the termination region A2. In the embodiment shown in FIG. 2, there are at least six p-type doped regions 111 and six n-type doped regions 113 in the termination region A2 to extend the distribution range of the electric field, thereby improving the breakdown voltage of the super-junction semiconductor device 1.

Please refer to FIG. 2. In the instant embodiment, the drift layer 11 further includes the lightly-doped region 114 adjacent to the surface 11a thereof and arranged in the termination region A2. The lightly-doped region 114 is connected between the surface 11a and the p-type doped regions 111. Specifically, the lightly-doped region 114 is located at one side of each p-type doped region 111 closer to the surface 11a of the drift layer 11 and connects to the surface 11a. Moreover, the lightly-doped region 114 has a conductivity type opposite to that of the drift layer 11. In the instant embodiment, the lightly-doped region 114 extends from the cell region A1 toward the termination region A2 in a direction substantially parallel to the surface 11a. The lightly-doped region 114 includes a first ending portion 114a located in the cell region A1 and a second ending portion 114b located in the termination region A2.

The insulating layer 12 is disposed on the surface 11a of the drift layer 11 to cover the termination region A2. In one embodiment, the insulating layer 12 is an oxide layer or a nitride layer. Please refer to FIG. 1 and FIG. 2. The main loop-shaped field plate 13 is disposed on the insulating layer 12 to enlarge the distribution range of the electric field produced in the drift layer 11, thereby improving the withstand voltage of the super-junction semiconductor device 1 in the termination region A2. As shown in FIG. 1, the main loop-shaped field plate 13 is positioned at the peripheral region of the super-junction semiconductor device 1 and surrounds the central region of the super-junction semiconductor device 1.

Please refer to FIG. 2. In the embodiment of the instant disclosure, the main loop-shaped field plate 13 covers the second ending portion 114b of the lightly-doped region 114 so that the second ending portion 114b is positioned under the main loop-shaped field plate 13. Specifically, the main loop-shaped field plate 13 has a first end face 131 closer to the cell region A1 and a second end face 132 father away from the cell region A1, and the first and second end faces 131, 132 are located at different sides of the main loop-shaped field plate 13 and opposite to each other. In the instant embodiment, at least a portion of the main loop-shaped field plate 13 overlaps with the lightly-doped region 114 in a direction perpendicular to the surface 11a, and the main loop-shaped field plate 13 protrudes from the second ending portion 114b by a length L in a direction parallel to the surface 11a. That is, the length L is a distance between a vertical plane at which the second end face 132 of the loop-shaped field plate 13 is located and the second ending portion 114b of the lightly-doped region 114.

Notably, after the simulation test, the results show both the position of the main loop-shaped field plate 13 and the length L by which the main loop-shaped field plate 13 protrudes from the second ending portion 114b correlate to the breakdown voltage of the super-junction semiconductor device 1. In the instant embodiment, the portion of the main loop-shaped field plate 13 beyond the second ending portion 114b in a direction parallel to the surface 11a covers at least two p-type doped regions 111 and at least one n-type doped region. That is, the length L, the first width W1, and the second width W2 satisfy the following relationship: $A \times (W1+W2) > L > (A \times (W1+W2) - W2)$, in which "A" is a positive integer number. The main loop-shaped field plate 13 covering the second ending portion 114b of the lightly-doped region 114 can reduce the electric field strength produced in the second ending portion 114b. The depletion region formed between the lightly-doped region 114 and the drift layer 11 can be enlarged due to the field plate principle so that the electric field strength generated at the PN junctions, which are respectively between the drift layer 11 and the first ending portion 114a and between the drift layer 11 and the second ending portion 114b, can be reduced, thereby making the breakdown voltage of the super-junction semiconductor device 1 satisfy practical requirements.

Please refer to FIG. 1. The p-type doped regions 110, 111 extend in a first direction D1 parallel to the surface 11a. A top-view shape of the main loop-shaped field plate 13 has a first straight section 13a, a second straight section 13b, and a connecting portion 13c. The first straight section 13a is parallel to the first direction D1, and the second straight section 13b is substantially parallel to a second direction D2, in which the first and second directions are perpendicular to each other. That is, the first straight section 13a is substantially perpendicular to the second straight section 13b.

The connecting portion 13c is connected between the first straight section 13a and the second straight section 13b and arranged corresponding to a corner of the cell region A1. In the embodiment of the instant disclosure, the connecting portion 13c can be a curved portion or a right-angled portion, which is not limited in the instant disclosure.

A plurality of transistor structures 15 is arranged in the cell region A1. Each of the transistor structures 15 includes a body region 150, a source region 151, a gate insulating layer 152, a gate electrode 153, a dielectric layer 154, and a source electrode layer 155.

The body region 150 has a conductivity type opposite to that of the drift layer 11 but the same as that of the lightly-doped region 114. For example, both the substrate 10 and the drift layer 11 are doped to have n-type conductivity, and the body region 150 is doped to have p-type conductivity. In one embodiment, the body region 150 and the lightly-doped region 114 can be doped during the same implantation process. Additionally, each body region 150 correspondingly is connected to one of the p-type doped regions 110 in the cell region A1. To be more specific, the body region 150 is connected to an end portion of each p-type doped region 110 closer to the surface 11a of the drift layer 11.

At least one source region 151 is formed in each body region 150 having a conductivity type opposite to that of the body region 150, whereas the source region 151 has the same conductivity type as that of the drift layer 11 and the substrate 10. In the embodiment shown in FIG. 2, two separated source regions 151 are formed in each of the body region 150. Furthermore, each source region 151 is spaced apart from the n-type doped region 112 in the cell region A1 by the body region 150.

Both of the gate insulating layer 152 and the gate electrode 153 are disposed on the surface 11a of the drift layer 11, and the gate electrode 153 is electrically insulated from the drift layer 11 by the gate insulating layer 152. Furthermore, in the instant embodiment, the gate electrodes 153 are disposed on the gate insulating layer 152 corresponding to the position of each n-type doped region 112 in the cell region A1. Moreover, each gate electrode 153 is arranged to partially overlap with the two source regions 151 formed in the same body region 150.

The dielectric layer 154 covers the gate electrodes 153 and has a plurality of contact windows h1 (two contact windows are shown in FIG. 2). The contact windows h1 respectively correspond to the positions of the body regions 150. That is, before the formation of the source electrode layer 155, a portion of each body region 150 and a portion of each source regions 151 are exposed on the surface 11a of the drift layer 11 through the corresponding contact windows h1.

The source electrode layer 155 covers the dielectric 154. The source electrode layer 155 is electrically connected to each source region 151 through the contact windows h1. Additionally, the source electrode layer 155 can be electrically connected to the lightly-doped region 114 positioned in the termination region A2.

Notably, the source electrode layer 155 and the main loop-shaped field plate 13 are spaced apart from each other, as shown in FIG. 2. Specifically, an end face 155e of the source electrode layer 155 facing to the first end face 131 of the main loop-shaped field plate 13 are separated from each other by a predetermined distance d. The predetermined distance d is larger than the first width W1 of one of the p-type doped regions 111 or larger than the second width W2 of one of the n-type doped regions 113. In one embodiment, the source electrode layer 155 can be selected from the group consisting of titanium (Ti), platinum (Pt), tungsten (W), nickel (Ni), chromium (Cr), molybdenum (Mo), tin (Sn), and the metal silicide thereof.

Furthermore, the super-junction semiconductor device 1 further includes a seal ring 16. Seen from FIG. 1, which shows the top view of the super-junction semiconductor device 1 of the instant embodiment, the seal ring 16 encloses a region on top of the termination region A2 and the cell region A1 to prevent the super-junction semiconductor device 1 from damage due to the cutting stress, which may be generated during a cutting process. Additionally, the seal ring 16 is usually made of conductive material, such as metal, and electrically grounded to protect the super-junction semiconductor device 1 from electrostatic discharge damage caused by the electrostatic charge accumulation at the seal ring 16 during the cutting process.

Figure 3A:
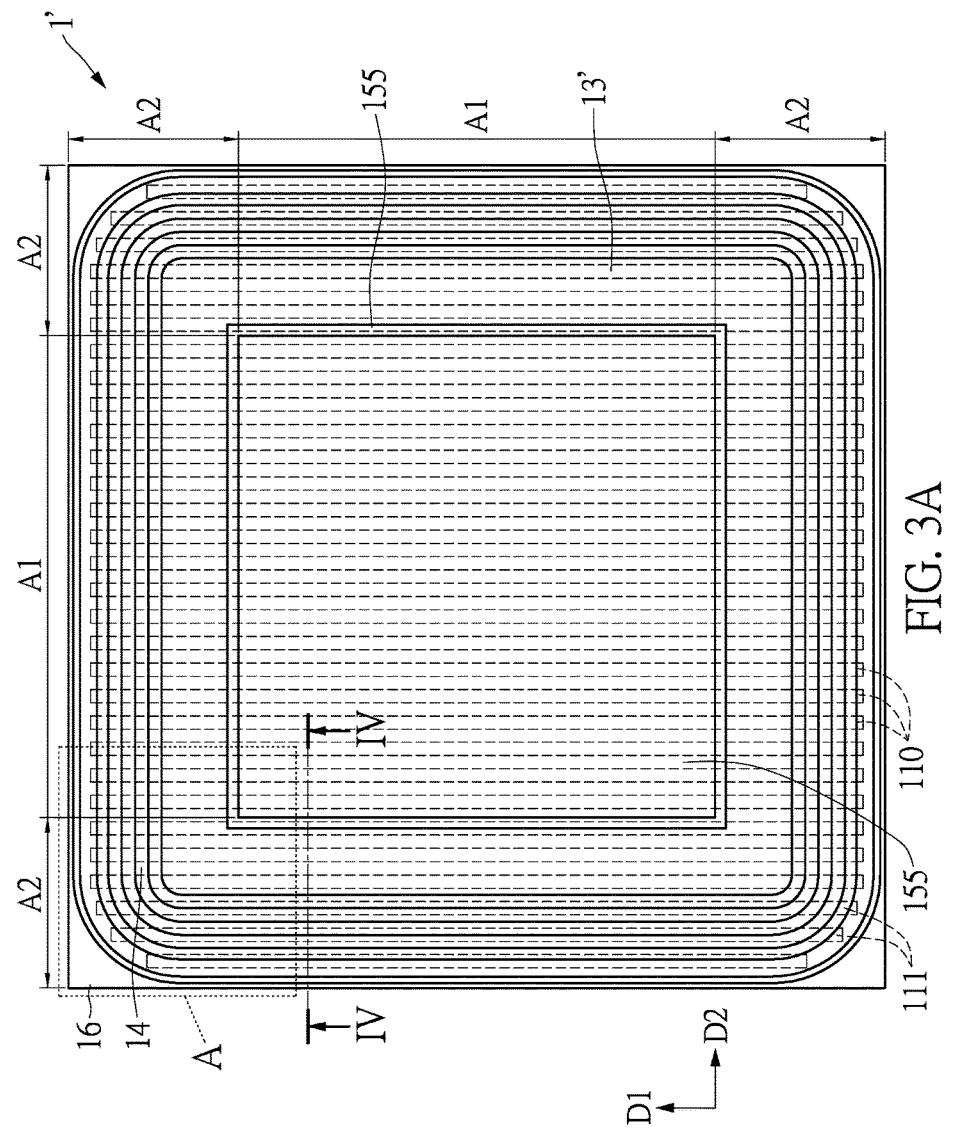
FIG. 3A shows a top view of a super junction semiconductor device according to another embodiment of the instant disclosure.
Figure 3B:
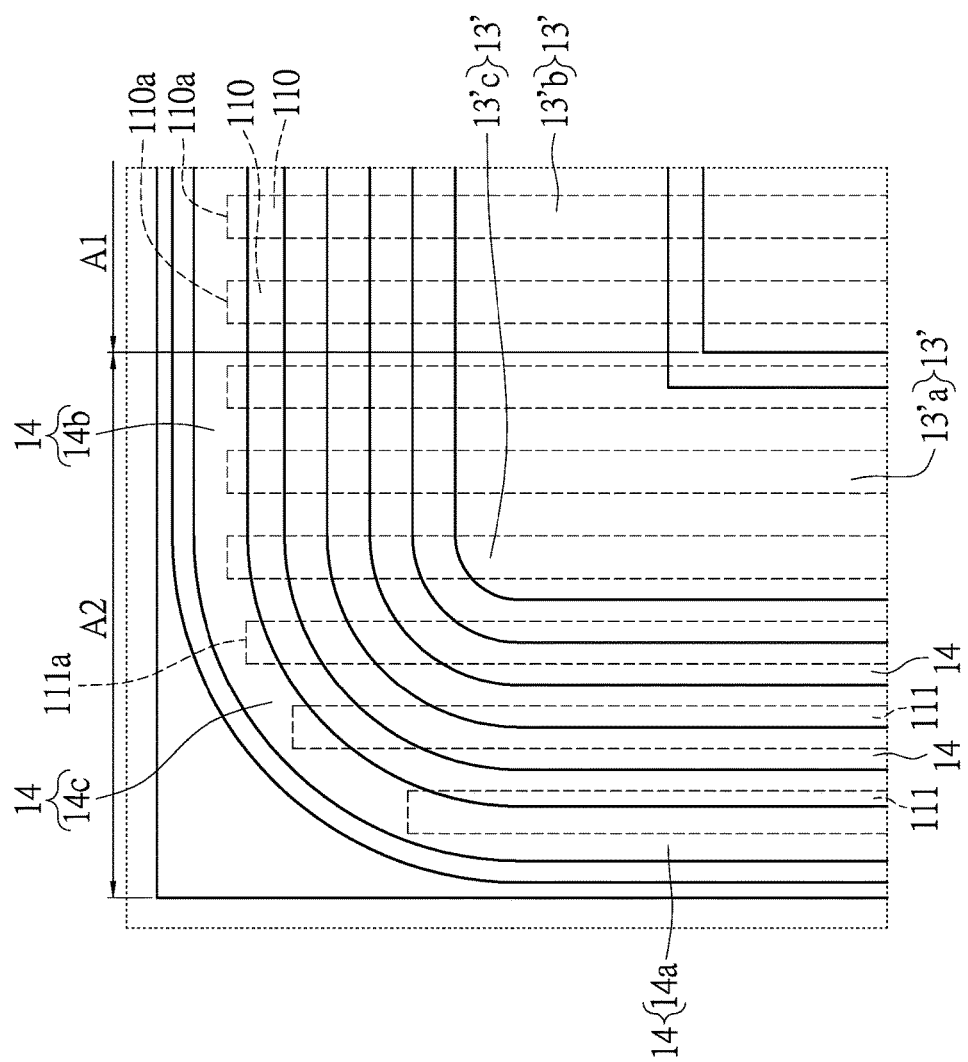
FIG. 3B shows an enlarged view of the region A shown in FIG. 3A.
Figure 4:
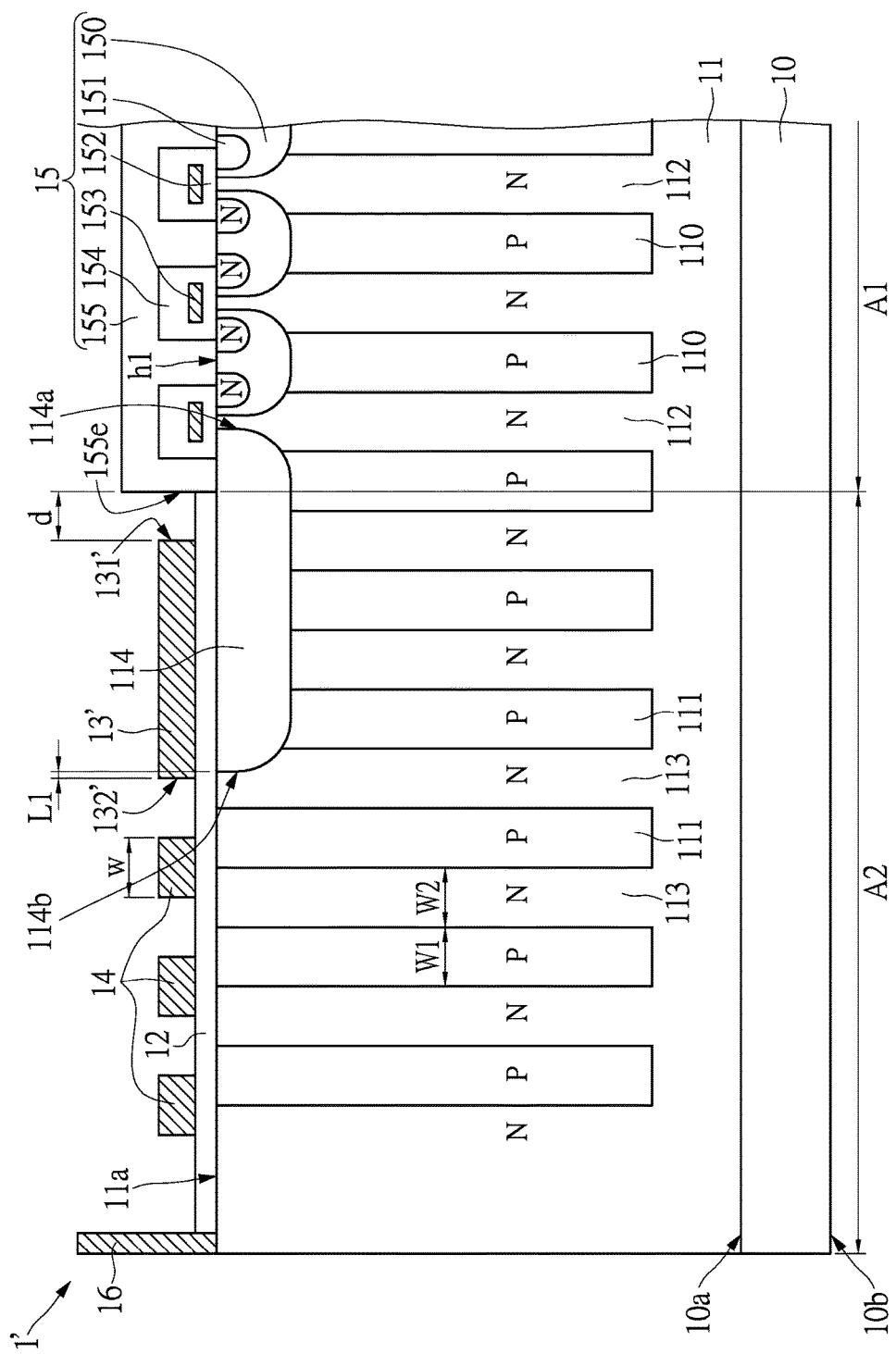
FIG. 4 shows a cross-sectional view taken on a line IV-IV of FIG. 3A.

Please refer to FIG. 3A, FIG. 3B, and FIG. 4. FIG. 3A shows a top view of a super-junction semiconductor device according to another embodiment of the instant disclosure, FIG. 3B shows an enlarged view of the region A shown in FIG. 3A, and FIG. 4 shows a cross-sectional view taken on a line IV-IV of FIG. 3A. The same reference numerals are given to the same components or to components corresponding to those in FIG. 1, and descriptions of the common portions are omitted. The super-junction semiconductor device 1' includes the main loop-shaped field plate 13' and at least one auxiliary loop-shaped field plate 14 (more than one auxiliary loop-shaped field plates 14 are shown in FIG. 3A).

Please refer to FIG. 4. The main loop-shaped field plate 13' covers the second ending portion 114b of the lightly-doped region 114 to reduce the electric field strength at the second ending portion 114b. In the instant embodiment, the main loop-shaped field plate 13' protrudes from the second ending portion 114b in a direction parallel to the surface 11a by a length L1, which is the shortest distance between a vertical plane, at which the second end face 132' of the main loop-shaped field plate 13' is located, and the second ending portion 114b. The length L1, the first width W1 of the p-type doped regions 110, 111, and the second width W2 of the n-type doped regions 112, 113 satisfy the following relationship: (A×(W1+W2)>L1>(A×(W1+W2)−W2)), in which "A" is a positive integer number.

In the instant embodiment, the main loop-shaped field plate 13' has a width larger than that of each auxiliary loop-shaped field plate 14. In one embodiment, all of the auxiliary loop-shaped field plates 14 can be designed to have the same width (w), as shown in FIG. 4. In addition, the main loop-shaped field plate 13' and the auxiliary loop-shaped field plates 14 can be made of conductive material, such as metal or heavily-doped polysilicon. Moreover, in the embodiment of the instant disclosure, the main loop-shaped field plate 13' is floating.

Please refer to FIG. 3A, the auxiliary loop-shaped field plates 14 are located outside of the main loop-shaped field plate 13' and surround the main loop-shaped field plate 13'. Each of the auxiliary loop-shaped field plates 14 has a first straight portion 14a substantially parallel to the first direction D1, a second straight portion 14b substantially parallel to the second direction D2, and a turning portion 14c connected between the first and second straight portions 14a, 14b.

As shown in FIG. 3B and FIG. 4, the first straight portion 14a covers an interface between the immediately adjacent n-type doped region 113 and p-typed doped region 111. Namely, each auxiliary loop-shaped field plate 14 is disposed on the interface between the n-type doped region 113 and the p-typed doped region 111. Moreover, each auxiliary loop-shaped field plate 14 has one portion closer to the cell region A1 covering the p-type doped region 111 and the other opposite portion covering the n-type doped region 113. In other words, an inner edge of each auxiliary loop-shaped field plate 14 is located on the p-type doped region 111, and an outer edge of each auxiliary loop-shaped field plate 14 is located on the n-type doped region 113.

In one embodiment, each of the auxiliary loop-shaped field plates 14 has a width (w) (i.e., the width of the first straight portion 14a), and the first width W1 of the p-type doped region 111, and the second width W2 of the n-type doped region 113 satisfy the following relationship: w≥0.5 (W1+W2).

Notably, the electric field strength generated at a position near to the surface 11a and each interface between the n-type doped region 113 and the p-type doped region 111 is usually relatively higher. Accordingly, by disposing each auxiliary loop-shaped field plate 14 to cover the corresponding interface between the n-type doped region 113 and the p-type doped region 111, the electric field accumulation phenomenon at each interface, as well as the surface electric field distribution, can be improved so as to increase the breakdown voltage of the super-junction semiconductor device 1'. To be more specific, the depletion region formed between the lightly-doped region 114 and the drift layer 11 can be enlarged due to the field plate principle so that the electric field strength generated at the PN junctions between the n-type doped regions 113 and the p-type doped regions 111 is reduced.

Please refer to FIG. 3B. Both the turning portion 14c of each auxiliary loop-shaped field plate 14 and the connecting portion 13c of the main loop-shaped field plate 13' are in a curved shape. In the instant embodiment, the outer most auxiliary loop-shaped field plate 14 has a larger width than those of the other auxiliary loop-shaped field plates 14, and the turning portion 14c of the outer most auxiliary loop-shaped field plate 14 covers an ending portion 111a of each p-type doped region 111. As shown in FIG. 3B, an imaginary connection line passing through each of the ending portions 111a of the p-type doped regions 111 is a curved line, and the turning portion 14c of the outer most auxiliary loop-shaped field plate 14 is superimposed on the curved line.

Additionally, as shown in FIGS. 3A and 3B, similar to the embodiment shown in FIG. 1, some of the p-type doped regions 110 positioned at the cell region A1 extend from the cell region A1 to the termination region A2 in two opposite directions. Notably, in the instant embodiment, two opposite ending portions 111a of each p-type doped region are under the outer most auxiliary loop-shaped field plate 14 in a direction perpendicular to the surface 11a of the drift layer 11. That is, seen from FIG. 3A, the outer most auxiliary loop-shaped field plate 14 disposed on the termination region A2 covers the two opposite ending portions 110a of each p-type doped regions 110. Furthermore, the outer most auxiliary loop-shaped field plate 14 also cover two opposite ending portions 111a of each p-type doped regions 111, as shown in FIG. 3B.

Figure 5:
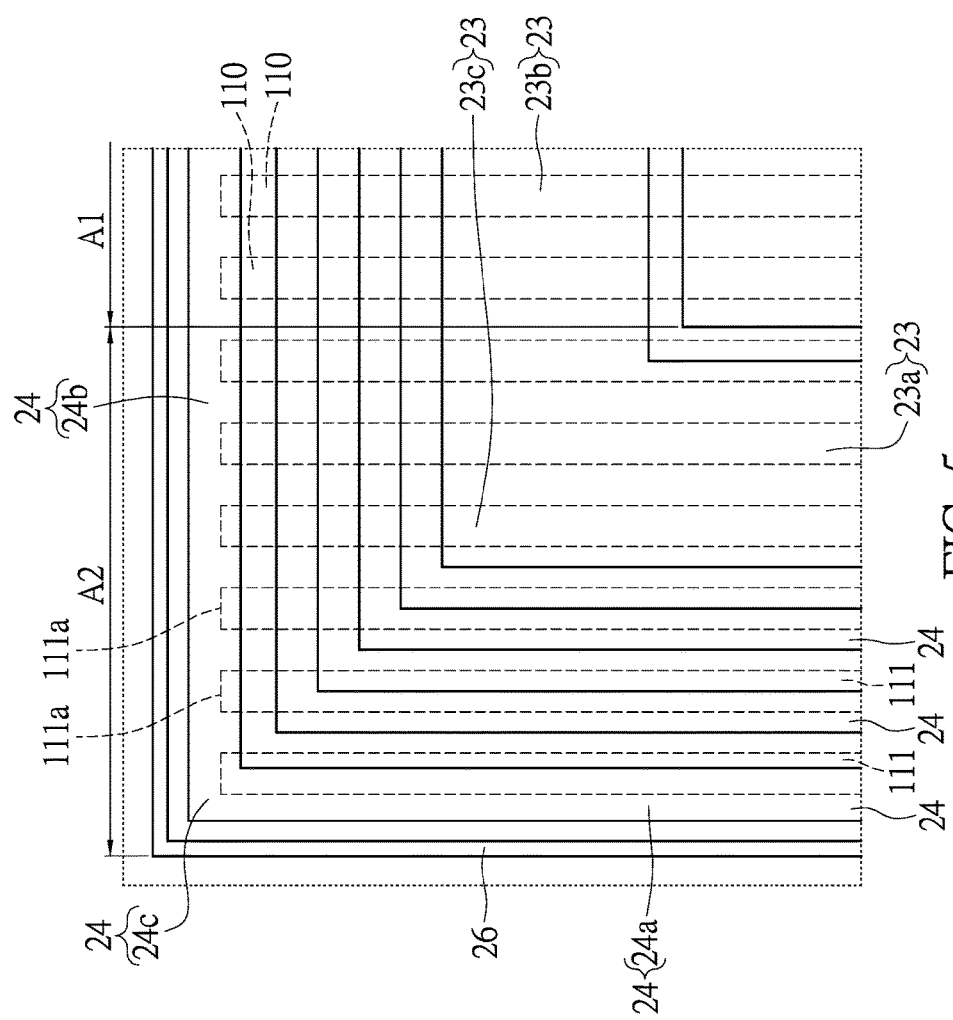
FIG. 5 shows a top view of a localized super junction semiconductor device according to another embodiment of the instant disclosure.

Please refer to FIG. 5. FIG. 5 shows a top view of a localized super-junction semiconductor device according to another embodiment of the instant disclosure. In the instant embodiment, the main loop-shaped field plate 23 includes a connecting portion 23c which is right-angled portion. Similarly, each of the auxiliary loop-shaped field plates 24 also has a right-angled turning portion 24c. In addition, similar to the embodiment shown in FIG. 3B, the outer most auxiliary loop-shaped field plate 24 covers each ending portion 110a, 111a of the p-type doped regions 110, 111. As such, the depletion region formed between the lightly-doped region 114 and the drift layer 11 can be enlarged so that the electric field strength generated at the PN junctions respectively between the ending portions 110a, 111a of the p-type doped regions 110, 111 and the n-type doped regions 112, 113 is reduced.

Figure 6:
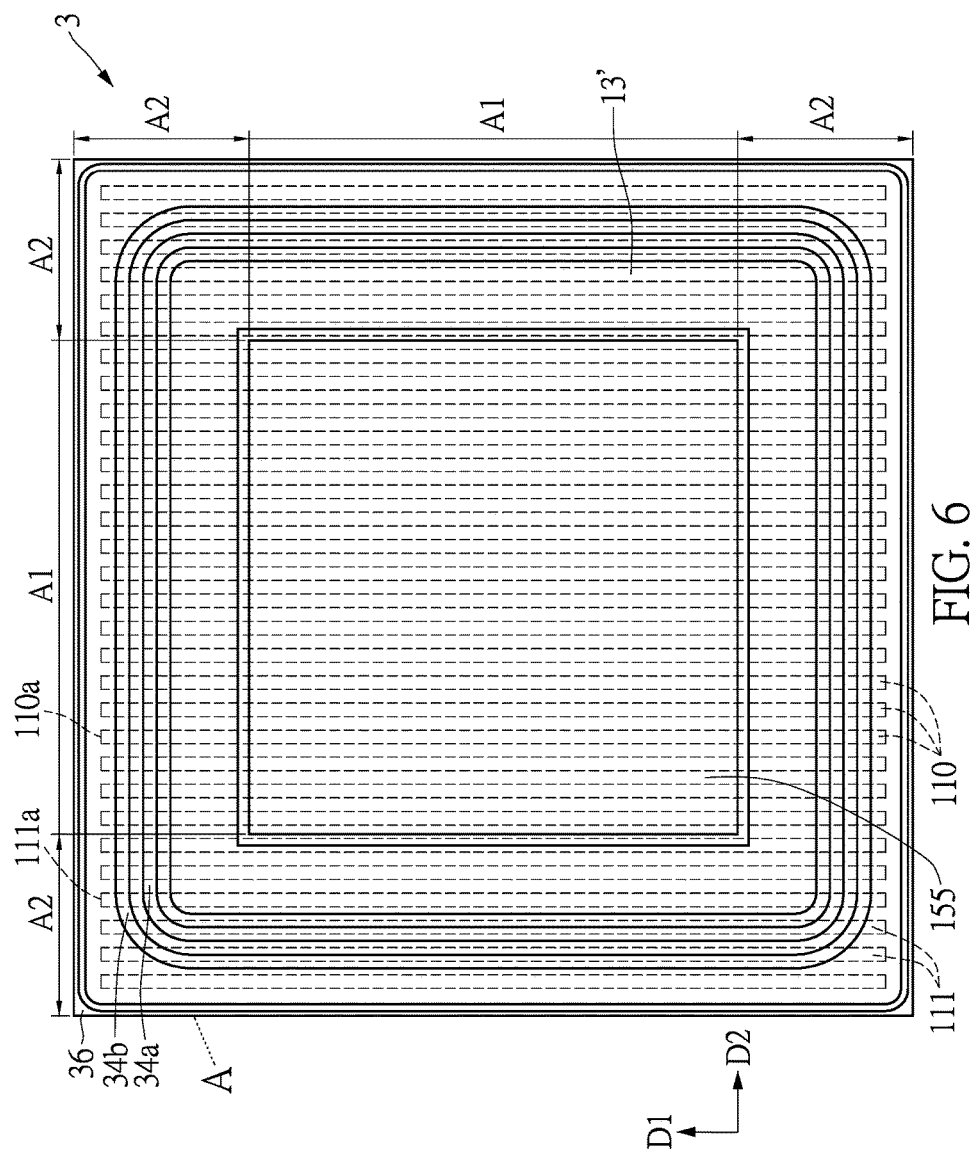
FIG. 6 shows a top view of a super junction semiconductor device according to another embodiment of the instant disclosure.

In another embodiment, the outer most auxiliary loop-shaped field plate 24 does not need to cover the ending portions 110a, 111a of the p-type doped regions 110, 111. Please refer to FIG. 6, which shows a top view of a super-junction semiconductor device according to another embodiment of the instant disclosure. In the instant embodiment, a plurality of auxiliary loop-shaped field plates 34a, 34b are sequentially disposed on the termination region A2 in a direction from the cell region A1 to an edge of the termination region A2.

The p-type doped regions 110a positioned at the cell region A1 extend toward an edge of the termination region in a direction parallel to a longitudinal direction of the p-type doped regions beyond the outer most auxiliary loop-shaped field plate 34b in a direction parallel to the surface 11a of the drift layer 11. That is, a portion of each of the p-type doped regions 110, 111 exceeds a region surrounded by the outer most auxiliary loop-shaped field plate 34b. Seen from the top view (FIG. 6), each of ending portions 110a, 111a of the p-type doped regions 110, 111 is located between the seal ring 36 and the outer most auxiliary loop-shaped field plate 34b.

To sum up, in the super-junction semiconductor devices provided in the instant disclosure, a plurality of p-type doped regions extends beyond the cell region A1 to the termination region A2 in a longitudinal direction thereof. Compared to the conventional super-junction transistor, since each of the p-type doped regions has no curved portion, the consideration of whether the lattice planes of the p-type doped regions match with each other or not can be omitted during the fabrication process of the p-type doped regions filling the p-type epitaxial material (in the trenches), thus reducing the fabrication difficulty and improving the epitaxial quality of the p-type doped regions. Furthermore, the p-type doped regions have substantially uniform impurity concentration, thereby avoiding decrease of the withstand voltage of the super-junction semiconductor device.

Moreover, in the super-junction semiconductor devices provided in the instant disclosure, the uses of the main and auxiliary loop-shaped field plates can improve the electric field distribution in the drift layer so that the breakdown voltage of the super-junction semiconductor device meets practical requirements. Specifically, by making the main loop-shaped field plate cover the second ending portion of the lightly-doped region, the electric field strength at the second ending portion can be reduced, thereby improving the breakdown voltage of the super-junction semiconductor device.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:
1. A super-junction semiconductor device comprising:
 a substrate;
 a drift layer disposed on the substrate and having a surface opposite to the substrate, wherein the drift layer includes a plurality of n-type doped regions and a plurality of p-type doped regions extending from the surface toward the substrate and arranged alternately to form a super-junction structure, and the drift layer defines a cell region, and a termination region surrounding the cell region;
 at least one transistor structure arranged in the cell region, the transistor structure including a source electrode layer disposed on the drift layer;
 a lightly-doped region formed in the drift layer and connected to the surface of the drift layer, the lightly-doped region having a first ending portion closer to the cell region and a second ending portion farther away from the cell region;
 an insulating layer disposed on the surface to cover the termination region; and
 a main loop-shaped field plate disposed on the insulating layer, wherein the main loop-shaped field plate covers the second ending portion, wherein the source electrode layer does not overlap the main loop-shaped field plate in a direction perpendicular to the surface of the drift layer.

2. The super-junction semiconductor device according to claim 1, wherein each of the p-type doped regions has a first width (W1) and a first concentration (p1), each of the n-type doped regions has a second width (W2) and a second concentration (n1), and the first width (W1), the first concentration (p1), the second width (W2), and the second concentration (n1) satisfy the following relationship: $p1 \times W1 = n1 \times W2$.

3. The super-junction semiconductor device according to claim 1, wherein at least six p-type doped regions and six n-type doped regions are arranged alternately in the termination region.

4. The super-junction semiconductor device according to claim 1, wherein the main loop-shaped field plate protrudes from the second ending portion by a length L in a direction parallel to the surface of the drift layer, each of the p-type doped regions has a first width (W1), each of the n-type doped regions has a second width (W2), and the length (L), the first width (W1), and the second width (W2) satisfy the following relationship: $A \times (W1+W2) > L > (A \times (W1+W2) - W2)$, wherein "A" is a positive integer number.

5. The super-junction semiconductor device according to claim 4, further comprising at least one auxiliary loop-shaped field plate arranged on the termination region and surrounding the main loop-shaped field plate, wherein a width of the main loop-shaped field plate is larger than a width of the auxiliary loop-shaped field plate.

6. The super-junction semiconductor device according to claim 5, wherein the width (W) of the auxiliary loop-shaped field plate, the first width (W1), and the second width (W2) satisfy the following relationship: $w \geq 0.5(W1+W2)$.

7. The super-junction semiconductor device according to claim 5, wherein the auxiliary loop-shaped field plate cover an interface between two immediately adjacent p-type and n-type doped regions, one portion of the auxiliary loop-shaped field plate closer to the cell region covers the p-type doped region, and the other opposite portion covers the n-type doped region.

8. The super-junction semiconductor device according to claim 5, wherein the p-type doped regions positioned at the cell region extend toward an edge of the termination region in a longitudinal direction thereof till ending portions of the p-type doped regions are under an outer most auxiliary loop-shaped field plate in a direction perpendicular to the surface of the drift layer.

9. The super-junction semiconductor device according to claim 5, wherein the p-type doped regions positioned at the cell region extend toward an edge of the termination region in a longitudinal direction of thereof beyond an outer most auxiliary loop-shaped field plate in the direction parallel to the surface of the drift layer.

10. The super-junction semiconductor device according to claim 1, wherein each of the p-type doped regions has a first width, the main loop-shaped field plate has an end face closer to the cell region and facing to an end surface of the source electrode layer, the end face is separated from the end surface of the source electrode layer by a predetermined distance, and the predetermined distance is larger than the first width.

11. The super-junction semiconductor device according to claim 1, wherein the p-type doped regions extend in a first direction parallel to the surface of the drift layer, the main loop-shaped field plate has a first straight section parallel to the first direction, a second straight section perpendicular to the first direction, and a connecting portion connecting between the first and second straight sections, and the connecting portion is a curved portion or a right-angled portion.

12. The super-junction semiconductor device according to claim 1, further comprising a seal ring disposed on a peripheral region of the termination region to prevent electrostatic discharge.

13. The super-junction semiconductor device according to claim 1, wherein the main loop-shaped field plate is floating.

* * * * *